United States Patent
Botez et al.

(10) Patent No.: US 8,848,754 B2
(45) Date of Patent: Sep. 30, 2014

(54) MULTIQUANTUM WELL STRUCTURES FOR SUPPRESSION OF ELECTRON LEAKAGE AND REDUCTION OF THRESHOLD-CURRENT DENSITY IN QUANTUM CASCADE LASERS

(75) Inventors: Dan Botez, Madison, WI (US); Jae Cheol Shin, Gwangsan-gu (KR)

(73) Assignee: Wisconsin Alumni Research Foundation, Madison, WI (US)

( * ) Notice: Subject to any disclaimer, the term of this patent is extended or adjusted under 35 U.S.C. 154(b) by 244 days.

(21) Appl. No.: 13/591,645

(22) Filed: Aug. 22, 2012

(65) Prior Publication Data

US 2014/0247850 A1  Sep. 4, 2014

(51) Int. Cl.
*H01S 5/00* (2006.01)
*H01S 5/34* (2006.01)
*H01S 5/20* (2006.01)
*H01S 5/32* (2006.01)

(52) U.S. Cl.
CPC .............. *H01S 5/3401* (2013.01); *H01S 5/34* (2013.01); *H01S 5/3407* (2013.01); *H01S 5/3412* (2013.01); *H01S 5/3418* (2013.01); *H01S 5/3425* (2013.01); *H01S 5/00* (2013.01); *H01S 5/2013* (2013.01); *H01S 5/3216* (2013.01); *H01S 5/3413* (2013.01); *H01S 5/20* (2013.01); *H01S 5/2009* (2013.01)
USPC ............. 372/43.01; 372/44.01; 372/45.011; 372/45.012; 372/50.1

(58) Field of Classification Search
CPC ........... H01S 5/00; H01S 5/20; H01S 5/2009; H01S 5/2013; H01S 5/3216; H01S 5/34; H01S 5/3407; H01S 5/3412; H01S 5/3413; H01S 5/3418; H01S 5/3425
USPC .................. 372/43.01, 44.01, 45.011, 45.012
See application file for complete search history.

(56) References Cited

U.S. PATENT DOCUMENTS

| | | | |
|---|---|---|---|
| 6,324,199 B1 * | 11/2001 | Capasso et al. ............ | 372/45.01 |
| 7,403,552 B2 | 7/2008 | Botez et al. | |
| 7,558,305 B2 | 7/2009 | Botez et al. | |
| 8,325,774 B2 * | 12/2012 | Botez et al. ................ | 372/45.01 |
| 8,428,093 B2 * | 4/2013 | Botez et al. ................ | 372/43.01 |
| 2005/0036530 A1 | 2/2005 | Schneider et al. | |
| 2009/0022196 A1 | 1/2009 | Botez et al. | |

OTHER PUBLICATIONS

Masselink et al., Low-threshold intersubband laser based on interface-scattering-rate engineering, Applied Physics Letters, vol. 100, No. 163502, Apr. 18, 2012, pp. 1-3.

(Continued)

*Primary Examiner* — Dung Nguyen
(74) *Attorney, Agent, or Firm* — Bell & Manning, LLC (57) ABSTRACT

Semiconductor structures for laser devices are provided. The semiconductor structures have a quantum cascade laser structure comprising an electron injector, an active region, and an electron extractor. The active region comprises an injection barrier, a multiquantum well structure, and an exit barrier. The multiquantum well structure can comprise a first barrier, a first quantum well, a second barrier, a second quantum well, and a third barrier. The energies of the first and second barrier are less than the energy of the third barrier. The energy difference between the energy of the second barrier and the energy of the third barrier can be greater than 150 meV and the ratio of the energy of the third barrier to the energy of the second barrier can be greater than 1.26.

25 Claims, 7 Drawing Sheets

(56) References Cited

OTHER PUBLICATIONS

Botez, Tapered Active-Region, Mid-Infrared Quantum Cascade Lasers for Complete Suppression of Carrier-Leakage Currents, 2012 Photonics West conference, Jan. 21-26, 2012.

Botez et al., Suppression of carrier leakage in 4.8 μm—emitting quantum cascade lasers, Novel In-Plane Semiconductor Lasers IX, edited by Alexey A. Belyanin and Peter M. Smowton, Proc. of SPIE vol. 7616, Feb. 8, 2010, pp. 1-9.

Shin et al., Ultra-low temperature sensitive deep-well quantum cascade lasers (λ=4.8μm) via uptapering conduction band edge of injector regions, Electronics Letters, vol. 45, No. 14, Jul. 2, 2009.

Vitiello et al., Influence of InAs, AlAs δlayers on the optical, electronic, and thermal characteristics of strain-compensated GaInAs/AlInAs quantum-cascade lasers, Applied Physics Letters, vol. 91, No. 161111, Oct. 17, 2007, pp. 1-3.

Bai et al., Highly temperature insensitive quantum cascade lasers, Applied Physics Letters, vol. 97, No. 251104, Dec. 20, 2010, pp. 1-3.

Botez et al., Electron leakage and its suppression via deep-well structures in 4.5- to 5.0-μm-emitting quantum cascade lasers, Optical Engineering, vol. 49, No. 111108, Nov. 2010, pp. 1-9.

Botez et al., Temperature dependence of the key electro-optical characteristics for midinfrared emitting quantum cascade lasers, Applied Physics Letters, vol. 97, No. 071101, Aug. 16, 2010, pp. 1-3.

Botez et al., The temperature dependence of key electro-optical characteristics for mid-infrared emitting quantum cascade lasers, Novel In-Plane Semiconductor Lasers X, edited by Alexey A. Belyanin and Peter M. Smowton, Proc. of SPIE vol. 7953, Feb. 3, 2011, pp. 1-12.

Botez et al., Electron-Leakage Suppression for High-Performance, Mid-Infrared QC and Intersubband Quantum Box Lasers, Available online at http://www.physique.univ-paris-diderot.fr/iqclsw/Workshop/Dan_Botez.pdf, Sep. 1, 2010.

Botez et al., Tapered active-region, mid-infrared quantum cascade lasers for complete suppression of carrier-leakage currents, Proc. SPIE 8277, Novel In-Plane Semiconductor Lasers XI, 82770W, Feb. 8, 2012.

Botez et al., Two-Dimensional Conduction-Band Engineering: Achieving Ultimate Wallplug Efficiency and Reliability for Quantum Cascade Lasers, Available online at http://miomd-11.northwestern.edu/technical/speakers.php?index=59&verbose=on, Apr. 1, 2012.

Shin, Tapered Active-Region Quantum Cascade Laser, Chapter 6 from Very Low Temperature Sensitive, Deep-Well Quantum Cascade Lasers (λ=4.8 μm) grown by MOCVD, May 10, 2011.

* cited by examiner

| Layer | Thickness (Å) |
|---|---|
| $In_{0.43}Ga_{0.57}As$ | 28 |
| $Al_{0.81}In_{0.19}As$ | 17 |
| $In_{0.41}Ga_{0.59}As$ | 25 |
| $Al_{0.81}In_{0.19}As$ | 17 |
| $In_{0.42}Ga_{0.58}As$ | 24 |
| $Al_{0.77}In_{0.23}As$ | 20 |
| $In_{0.37}Ga_{0.63}As$ | 22 |
| $Al_{0.77}In_{0.23}As$ | 22 |
| $In_{0.37}Ga_{0.63}As$ (doped) | 20 |
| $Al_{0.77}In_{0.23}As$ (doped) | 23 |
| $In_{0.37}Ga_{0.63}As$ (doped) | 18 |
| $Al_{0.77}In_{0.23}As$ (doped) | 25 |
| $In_{0.37}Ga_{0.63}As$ | 17 |
| $Al_{0.77}In_{0.23}As$ | 29 |
| $In_{0.37}Ga_{0.63}As$ | 19 |
| $Al_{0.77}In_{0.23}As$ | 16 |
| $Al_{0.84}In_{0.16}As$ | 23 |
| $In_{0.46}Ga_{0.54}As$ | 10 |
| $Al_{0.70}In_{0.30}As$ | 12 |
| $In_{0.46}Ga_{0.54}As$ | 40 |
| $Al_{0.70}In_{0.30}As$ | 11 |
| $In_{0.46}Ga_{0.54}As$ | 39 |
| $Al_{0.96}In_{0.04}As$ | 11 |
| $In_{0.46}Ga_{0.54}As$ | 33 |
| $Al_{0.87}In_{0.13}As$ | 22 |

| Layer | Thickness (Å) |
|---|---|
| $In_{0.66}Ga_{0.34}As$ | 28 |
| $Al_{0.65}In_{0.35}As$ | 17 |
| $In_{0.64}Ga_{0.36}As$ | 25 |
| $Al_{0.65}In_{0.35}As$ | 17 |
| $In_{0.64}Ga_{0.36}As$ | 24 |
| $Al_{0.56}In_{0.44}As$ | 20 |
| $In_{0.60}Ga_{0.40}As$ | 22 |
| $Al_{0.56}In_{0.44}As$ | 22 |
| $In_{0.60}Ga_{0.40}As$ (doped) | 20 |
| $Al_{0.56}In_{0.44}As$ (doped) | 23 |
| $In_{0.60}Ga_{0.40}As$ (doped) | 18 |
| $Al_{0.56}In_{0.44}As$ (doped) | 25 |
| $In_{0.60}Ga_{0.40}As$ | 17 |
| $Al_{0.56}In_{0.44}As$ | 29 |
| $In_{0.60}Ga_{0.40}As$ | 17 |
| $Al_{0.56}In_{0.44}As$ | 18 |
| $Al_{0.65}In_{0.35}As$ | 24 |
| $In_{0.68}Ga_{0.32}As$ | 10 |
| $Al_{0.60}In_{0.40}As$ | 12 |
| $In_{0.68}Ga_{0.32}As$ | 41 |
| $Al_{0.60}In_{0.40}As$ | 11 |
| $In_{0.68}Ga_{0.32}As$ | 40 |
| $Al_{0.85}In_{0.15}As$ | 12 |
| $In_{0.68}Ga_{0.32}As$ | 35 |
| $Al_{0.75}In_{0.25}As$ | 22 |

| Layer | Thickness (Å) |
|---|---|
| In$_{0.53}$Ga$_{0.47}$As | 35 |
| Al$_{0.60}$In$_{0.40}$As | 14 |
| In$_{0.53}$Ga$_{0.47}$As | 30 |
| Al$_{0.60}$In$_{0.40}$As | 16 |
| In$_{0.53}$Ga$_{0.47}$As | 28 |
| Al$_{0.48}$In$_{0.52}$As | 20 |
| In$_{0.53}$Ga$_{0.47}$As | 25 |
| Al$_{0.48}$In$_{0.52}$As | 23 |
| In$_{0.53}$Ga$_{0.47}$As (doped) | 25 |
| Al$_{0.48}$In$_{0.52}$As (doped) | 25 |
| In$_{0.53}$Ga$_{0.47}$As (doped) | 25 |
| Al$_{0.48}$In$_{0.52}$As | 36 |
| In$_{0.53}$Ga$_{0.47}$As | 21 |
| Al$_{0.48}$In$_{0.52}$As | 53 |
| In$_{0.57}$Ga$_{0.43}$As | 18 |
| Al$_{0.48}$In$_{0.52}$As | 19 |
| In$_{0.57}$Ga$_{0.43}$As | 46 |
| Al$_{0.48}$In$_{0.52}$As | 10 |
| In$_{0.57}$Ga$_{0.43}$As | 43 |
| Al$_{0.60}$In$_{0.40}$As | 15 |
| In$_{0.57}$Ga$_{0.43}$As | 39 |
| Al$_{0.60}$In$_{0.40}$As | 25 |

FIG. 4B

MULTIQUANTUM WELL STRUCTURES FOR SUPPRESSION OF ELECTRON LEAKAGE AND REDUCTION OF THRESHOLD-CURRENT DENSITY IN QUANTUM CASCADE LASERS

REFERENCE TO GOVERNMENT RIGHTS

This invention was made with government support under ECCS-0925104 awarded by the National Science Foundation and under N68335-11-C-0432 awarded by the Navy and under W911NF-12-C-0033 awarded by the Army. The government has certain rights in the invention.

BACKGROUND

Quantum cascade lasers (QCLs) are made of stages each of which is composed of three regions: an electron injector, an active region and an electron extractor. In conventional QCLs, the quantum wells and barriers in all regions are of the same, fixed alloy composition, respectively. In addition, for short wavelength ($\lambda \sim 4.6$-$4.8$ μm) QCLs operated around room temperature, the electrons in the injector and upper laser level are found to have a higher temperature than that of the lattice—that is, they are hot. See D. Botez et al., *Proc. SPIE Novel In-Plane Semiconductor Lasers X Conf.* 7953, 79530N (2011); D. Botez et al., *Proc. SPIE* 8277, 82770W (2012). Consequently, conventional QCLs emitting in the 4.5-5.0 μm range experience substantial electron leakage which results in low characteristic-temperature $T_0$ values (e.g., ~140 K) for the threshold-current density, $J_{th}$, and low characteristic-temperature $T_1$ (e.g., ~140K) values for the slope efficiency, $\eta_{sl}$ at heatsink temperatures above room temperature. Id. As a result, the maximum wallplug efficiency $\eta_{wp,max}$ in continuous wave (CW) operation at room temperature (for light emitted at 300 K from the front facet of devices with high-reflectivity-coated back facets) has typical values that fall far short (e.g., 13%) of the theoretically predicted upper limit of ~32% at $\lambda$=4.6 μm. See D. Botez et al., *Proc. SPIE Novel In-Plane Semiconductor Lasers X Conf.* 7953, 79530N (2011). Other designs for QCLs have been proposed to address the issue of electron leakage. However, in order to maximize efficiencies, designs which further suppress electron leakage and reduce threshold-current density are needed.

SUMMARY

Semiconductor structures and laser devices including the semiconductor structures are provided.

In one embodiment, a semiconductor structure comprises an electron injector, an active region adjacent to the electron injector, and an electron extractor adjacent to the active region. The electron injector, active region, and electron extractor each comprise layers of semiconductor, the layers configured to provide alternating quantum wells and barriers. The active region comprises an injection barrier, an exit barrier and a multiquantum well structure between the injection barrier and the exit barrier. The multiquantum well structure comprises a first barrier, a first quantum well adjacent to the first barrier, a second barrier adjacent to the first quantum well, a second quantum well adjacent to the second barrier, and a third barrier adjacent to the second quantum well. The energies of the first barrier and the second barrier are less than the energy of the third barrier, the energy difference between the energy of the second barrier and the energy of the third barrier is greater than 225 meV and the ratio of the energy of the third barrier to the energy of the second barrier is greater than 1.26.

In another embodiment, a semiconductor structure comprises an electron injector, an active region adjacent to the electron injector, and an electron extractor adjacent to the active region. The electron injector, active region, and electron extractor each comprise layers of semiconductor, the layers configured to provide alternating quantum wells and barriers. The active region comprises an injection barrier, an exit barrier and a multiquantum well structure between the injection barrier and the exit barrier. The multiquantum well structure comprises a first barrier, a first quantum well adjacent to the first barrier, a second barrier adjacent to the first quantum well, a second quantum well adjacent to the second barrier, and a third barrier adjacent to the second quantum well. The energies of the first barrier and the second barrier are less than the energy of the third barrier, the energy difference between the energy of the second barrier and the energy of the third barrier is greater than 150 meV and the ratio of the energy of the third barrier to the energy of the second barrier is greater than 1.26. The semiconductor structure is configured to provide a laser device emitting at a wavelength greater than about 5 μm.

In another embodiment, a semiconductor structure comprises an electron injector, an active region adjacent to the electron injector, and an electron extractor adjacent to the active region. The electron injector, active region, and electron extractor each comprise layers of semiconductor, the layers configured to provide alternating quantum wells and barriers. The active region comprises an injection barrier, an exit barrier and a multiquantum well structure between the injection barrier and the exit barrier. The multiquantum well structure comprises a first barrier, a first quantum well adjacent to the first barrier, a second barrier adjacent to the first quantum well, a second quantum well adjacent to the second barrier, and a third barrier adjacent to the second quantum well. The energies of the first barrier and the second barrier are less than the energy of the third barrier, the energy of at least one of the first barrier and the second barrier is equal to or less than the energy of the barriers of the electron injector, and the energy of the third barrier is greater than the energy of the barriers of the electron injector.

In another embodiment, a semiconductor structure comprises an electron injector, an active region adjacent to the electron injector, and an electron extractor adjacent to the active region. The electron injector, active region, and electron extractor each comprise layers of semiconductor, the layers configured to provide alternating quantum wells and barriers. The active region comprises an injection barrier, an exit barrier and a multiquantum well structure between the injection barrier and the exit barrier. The multiquantum well structure comprises a first barrier, a first quantum well adjacent to the first barrier, a second barrier adjacent to the first quantum well, and a second quantum well adjacent to the second barrier. The energies of the first barrier and the second barrier are less than the energy of the exit barrier, the energy difference between the energy of the second barrier and the energy of the exit barrier is greater than 225 meV and the ratio of the energy of the exit barrier to the energy of the second barrier is greater than 1.26.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings.

DETAILED DESCRIPTION

Semiconductor structures and laser devices including the semiconductor structures are provided. At least some embodiments of the semiconductor structures are capable of providing laser devices emitting mid- to long-wavelength infrared radiation (i.e., 3-16 μm) and operating at high power (i.e., watt-range) and high wallplug efficiency during quasi-continuous wave or continuous wave (CW) operation over long periods of time (i.e., >1000 hours). Such laser devices are suited for use in a variety of applications, ranging from environmental monitoring to remote detection of explosives and to missile-avoidance systems for both commercial and military air vehicles.

As further discussed below, the present invention is based, at least in part, on the inventors' findings that electron leakage can be virtually suppressed and threshold-current density, $J_{th}$, can be significantly reduced (beyond that provided via the suppression of electron leakage) by using certain multiquantum well structures in the active regions of QCL devices. Thus, laser devices including at least some embodiments of the disclosed semiconductor structures exhibit superior electro-optical characteristics as compared to conventional and other QCLs. In particular, the combination of very low $J_{th}$ values and virtually suppressed electron leakage leads to significantly higher pulsed or continuous wave (CW) wallplug efficiencies at room temperature.

Figure 1:
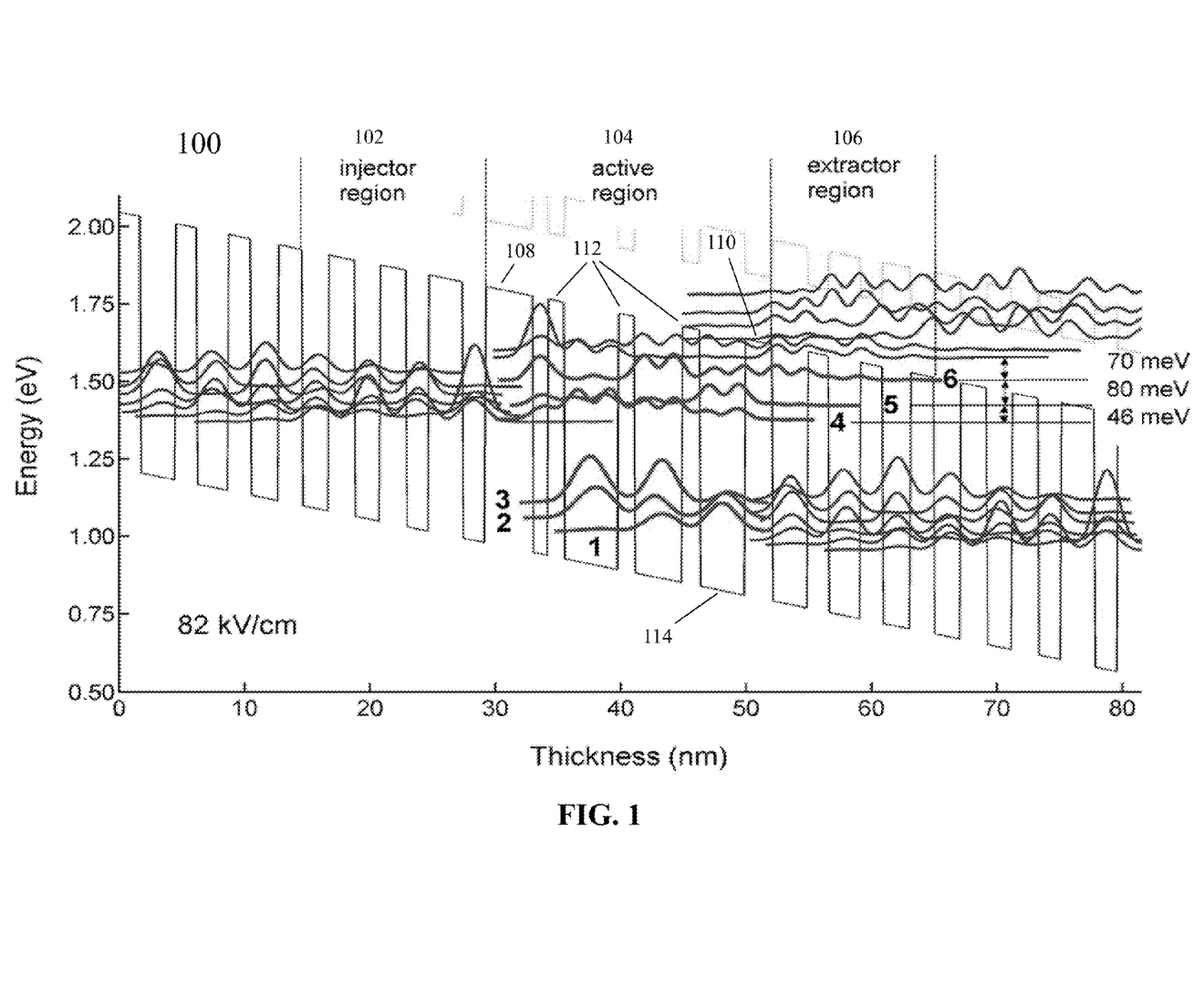
FIG. 1 shows the band diagram and relevant wavefunctions for a conventional QCL.

For purposes of providing additional background for the disclosed invention, FIG. 1 shows the band diagram and relevant wavefunctions for a conventional QCL emitting at 4.7 μm. One stage 100 of the QCL includes an injector region 102, an active region 104, and an extractor region 106. The barriers of the active region include an injection barrier 108, an exit barrier 110, and intermediate barriers 112. Electrons are injected from the ground level, g, in the injector region into the upper laser state 4 in the active region. Some electrons relax down to the lower laser state 3, with light being emitted at the desired wavelength. The primary electron leakage mechanism is thermal excitation from the upper laser state 4, to the next higher energy level in the active region, state 5, followed by relaxation to all lower active region energy levels. FIG. 1 also shows the energy difference between states 4 and 5 ($E_{54}$=46 meV). The leakage-current density, $J_{leak}$, is directly proportional to the scattering rate from states 4 to 5: $\tau_{45}^{-1} \sim \tau_{54}^{-1} \exp(-E_{54}/T_{e4})$, where $E_{54}$ is the energy difference between states 4 and 5 and $T_{e4}$ is the electronic temperature in state 4. See D. Botez, et al., "Temperature dependence of the key electro-optical characteristics for midinfrared emitting quantum cascade lasers," *Applied Physics Letters*, 97, 071101 (2010); D. Botez, et al., Erratum: "Temperature dependence of the key electro-optical characteristics for midinfrared emitting quantum cascade lasers" [*Appl. Phys. Lett.* 97, 071101 (2010)], *Applied Physics Letters*, 97, 199901 (2010); and D. Botez, "Comment on "Highly temperature insensitive quantum cascade lasers" [*Appl. Phys. Lett.* 97, 251104 (2010)], *Applied Physics Letters*, 98, 216101 (2011), each of which is hereby incorporated by reference in its entirety. For the QCL of FIG. 1, $\tau_{54}$ is 0.25 ps.

Another relevant parameter is the global "effective" upper state lifetime $\tau_{up,g}$ which is given by $\tau_{up,g} = \tau_{4g}(1 - \tau_{3g}/\tau_{43})$, where $\tau_{4g}$ and $\tau_{3g}$ are the global electron lifetimes of states 4 and 3, respectively, corresponding to transitions to all lower active region states [i.e., to states 3, 2, 1 (for state 4) and to extractor states penetrating into the active region]. In particular, $\tau_{up,g}$ strongly influences $J_{th}$ since $J_{th} = (A/\tau_{up,g}) + J_{leak}$, where A is a quantity that includes the device modal gain and the thermal backfilling of the lower laser level. For the QCL of FIG. 1, $\tau_{up,g}$ is 1.235 ps.

As noted above, the present invention is based, at least in part, on the inventors' findings that multiquantum well structures having certain configurations of quantum wells and barriers can greatly suppress electron leakage and decrease threshold-current density when incorporated into the active regions of QCLs. Not only do at least some embodiments of the multiquantum well structures provide laser devices exhibiting very high values of $E_{54}$ and $\tau_{54}$, but also, they provide laser devices exhibiting very high values of $\tau_{up,g}$. Thus, $J_{leak}$ is significantly decreased (from high values of $E_{54}$ and $\tau_{54}$) and $J_{th}$ is further decreased (from high values of $\tau_{up,g}$). In addition, the inventors have found that the first-order Stark effect can be minimized by use of certain configurations of the quantum wells and barriers in the multiquantum well structures, which, at least in part, allows these high values of $E_{54}$ to be realized. See D. Botez et al., "Tapered active-region, mid-infrared quantum cascade lasers for complete suppression of carrier-leakage currents," Proc. SPIE 8277, 82770W (2012), which is hereby incorporated by reference in its entirety.

Semiconductor structures are provided which comprise an electron injector, an active region adjacent to the electron injector, and an electron extractor adjacent to the active region. The electron injector, active region, and electron extractor each comprise layers of semiconductor, the layers configured to provide alternating quantum wells and barriers. The active region comprises an injection barrier, an exit barrier and a multiquantum well structure between the injection barrier and the exit barrier. In one embodiment, the multiquantum well structure comprises a first barrier, a first quantum well adjacent to the first barrier, a second barrier adjacent to the first quantum well, a second quantum well adjacent to the second barrier, and a third barrier adjacent to the second quantum well. The energies of the first barrier and the second barrier are less than the energy of the third barrier.

In the multiquantum well structure, the first quantum well may be downstream from the first barrier; the second barrier may be downstream from the first quantum well; the second quantum well may be downstream from the second barrier; and the third barrier may be downstream from the second quantum well. The direction "downstream" is the same direction as the direction of the electron flow in a QCL device incorporating the disclosed semiconductor structures.

The energies of the first barrier and the second barrier may assume a range of values (i.e., less than, equal to, or greater than) relative to the energy of the barriers of the electron injector. However, in some embodiments, the energy of at least one of the first barrier and the second barrier is less than or equal to the energy of the barriers of the electron injector. In some embodiments, the energy of the first barrier is less than or equal to the energy of the barriers of the electron injector. In some embodiments, the energy of the second barrier is less than or equal to the energy of the barriers of the electron injector. In some embodiments, the energies of both the first barrier and the second barrier are less than or equal to the energy of the barriers of the electron injector. In some embodiments, the energy of at least one of the first barrier and the second barrier is greater than the energy of the barriers of the electron injector. In some embodiments, the energy of the first barrier is greater than the energy of the barriers of the electron injector. In some embodiments, the energy of the second barrier is greater than the energy of the barriers of the electron injector. In some embodiments, the energies of both the first barrier and the second barrier are greater than the energy of the barriers of the electron injector.

The energies of the first barrier and the second barrier may assume a range of values (i.e., less than, equal to, or greater than) relative to the energy of the injection barrier. However, in some embodiments, the energies of both the first barrier and the second barrier are less than the energy of the injection barrier. In some embodiments, the energies of both the first barrier and the second barrier are equal to or greater than the energy of the injection barrier. In some embodiments, the energy of the first barrier is equal to or less than the energy of the injection barrier and the energy of the second barrier is greater than the energy of the injection barrier.

The energies of the first barrier and the second barrier may assume a range of values (i.e., less than, equal to, or greater than) relative to the energy of the exit barrier. However, in some embodiments, the energies of both the first barrier and the second barrier are less than the energy of the exit barrier.

The energies of the first barrier and the second barrier may assume a range of values relative to each other. However, in some embodiments, the energy of the first barrier is less than the energy of the second barrier. In some embodiments, the energy of the first barrier is greater than the energy of the second barrier. In some embodiments, the energies of the first barrier and the second barrier are the same. In some embodiments, the energies of the first barrier and the second barrier are substantially the same. By "substantially" it is meant that the energy difference between the energy of the first barrier and the energy of the second barrier is 10 meV or less. This includes embodiments in which the energy difference is 8 meV or less, 6 meV or less, 4 meV or less, 2 meV or less, or 1 meV or less.

The energy of the third barrier may assume a range of values (i.e., less than, equal to, or greater than) relative to the energy of the barriers of the electron injector. However, in some embodiments, the energy of the third barrier is greater than the energy of the barriers of the electron injector.

The energy of the third barrier may assume a range of values (i.e., less than, equal to, or greater than) relative to the energy of the injection barrier. However, in some embodiments, the energy of the third barrier is greater than the energy of the injection barrier.

The energy of the third barrier may assume a range of values (i.e., less than, equal to, or greater than) relative to the energy of the exit barrier. However, in some embodiments, the energy of the third barrier is greater than the energy of the exit barrier. In some embodiments, the energies of the third barrier and the exit barrier are the same. In some embodiments, the energies of the third barrier and the exit barrier are substantially the same. By "substantially" it is meant that the energy difference between the energy of the third barrier and the energy of the exit barrier is 10 meV or less. This includes embodiments in which the energy difference is 8 meV or less, 6 meV or less, 4 meV or less, 2 meV or less, or 1 meV or less.

As noted above, in the disclosed semiconductor structures, the energies of the first barrier and the second barrier are less than the energy of the third barrier. In some embodiments, the difference in energy between the energy of the second barrier and the energy of the third barrier is greater than 150 meV. This includes embodiments in which the difference in energy between the energy of the second barrier and the energy of the third barrier is greater than 175 meV, greater than 180 meV, greater than 200 meV, greater than 225 meV, greater than 250 meV, greater than 275 meV, greater than 300 meV, greater than 325 meV, greater than 350 meV, greater than 375 meV, or greater than 400 meV.

In some embodiments, the ratio of the energy of the third barrier to the energy of the second barrier is greater than 1.20. This includes embodiments in which the ratio of energy of the third barrier to the energy of the second barrier is greater than 1.22, greater than 1.24, greater than 1.26, greater than 1.28, greater than 1.30, greater than 1.32, greater than 1.34, greater than 1.36, greater than 1.38, greater than 1.40, greater than 1.42, greater than 1.44, greater than 1.46, greater than 1.48, or greater than 1.50.

In some embodiments, the difference in energy between the energy of the second barrier and the energy of the third barrier is within any of the ranges disclosed above and the ratio of the energy of the third barrier to the energy of the second barrier is within any of the ranges disclosed above. By way of example only, in some embodiments, the difference in energy between the energy of the second barrier and the energy of the third barrier is greater than 225 meV and the ratio of the energy of the third barrier to the energy of the second barrier is greater than 1.26.

The energy of the injection barrier may assume a range of values (i.e., less than, equal to, or greater than) relative to the energy of the barriers of the electron injector. However, in some embodiments, the energy of the injection barrier is greater than the energy of the barriers of the electron injector. In some embodiments, the energy of the injection barrier is equal to the energy of the barriers of the electron injector. Similarly, the energy of the injection barrier may assume a range of values (i.e., less than, equal to, or greater than) relative to the energy of the exit barrier. However, in some embodiments, the energy of the injection barrier is less than the energy of the exit barrier.

The energy of the exit barrier may assume a range of values (i.e., less than, equal to, or greater than) relative to the energy of the barriers of the electron injector. However, in some embodiments, the energy of the exit barrier is greater than the energy of the barriers of the electron injector.

Various configurations may be used in which the injection barrier, first barrier, second barrier, third barrier and exit barrier have the energies disclosed above in various combinations. Specific, exemplary configurations are described in the Examples below.

Other quantum wells and barriers may be included between the injection barrier and the multiquantum well structure and between the multiquantum well structure and the exit barrier. In some embodiments, a quantum well is between the injection barrier and the multiquantum well structure, such that the first barrier of the multiquantum well structure is adjacent to the quantum well which is adjacent to the injection barrier. However, in some embodiments, one or more barriers and associated quantum wells are between the injection barrier and the first barrier of the multiquantum well structure. In some embodiments, a quantum well is between the multiquantum well structure and the exit barrier, such that the third barrier of the multiquantum well structure is adjacent to the quantum well which is adjacent to the exit barrier. However, in some embodiments, one or more barriers and associated quantum wells are between the exit barrier and the third barrier of the multiquantum well structure.

In addition to the multiquantum well structures described above, multiquantum well structures for single-phonon-resonance semiconductor structures are also contemplated. For clarity, such multiquantum well structures will be referred to as single-phonon-resonance multiquantum well structures below. Thus, in one embodiment, a single-phonon-resonance multiquantum well structure comprises a first barrier, a first quantum well adjacent to the first barrier, a second barrier adjacent to the first quantum well, and a second quantum well adjacent to the second barrier. The energies of the first barrier and the second barrier are less than the energy of the exit barrier. In the single-phonon-resonance multiquantum well structure, the first quantum well may be downstream from the first barrier; the second barrier may be downstream from the first quantum well; and the second quantum well may be downstream from the second barrier. The energies of the first barrier and the second barrier may assume the range of values relative to the energy of the barriers of the electron injector as described above. The energies of the first barrier and the second barrier may assume the range of values relative to the energy of the injection barrier as described above. The energies of the first barrier and the second barrier may assume the range of values relative to each other as described above. The energy of the exit barrier may assume the range of values relative to the energy of the barriers of the electron injector and relative to the energy of the injection barrier as described above. The energy of the injection barrier may assume the range of values relative to the energy of the barriers of the electron injector as described above.

In some embodiments of the single-phonon-resonance multiquantum well structures, the difference in energy between the energy of the second barrier and the energy of the exit barrier is greater than 225 meV. This includes embodiments in which the difference in energy between the energy of the second barrier and the energy of the exit barrier is greater than 250 meV, greater than 275 meV, greater than 300 meV, greater than 325 meV, greater than 350 meV, greater than 375 meV, or greater than 400 meV.

In some embodiments of the single-phonon-resonance multiquantum well structures, the ratio of the energy of the exit barrier to the energy of the second barrier is greater than 1.20. This includes embodiments in which the ratio of energy of the exit barrier to the energy of the second barrier is greater than 1.22, greater than 1.24, greater than 1.26, greater than 1.28, greater than 1.30, greater than 1.32, greater than 1.34, greater than 1.36, greater than 1.38, greater than 1.40, greater than 1.42, greater than 1.44, greater than 1.46, greater than 1.48, or greater than 1.50.

In some embodiments of the single-phonon-resonance multiquantum well structures, the difference in energy between the energy of the second barrier and the energy of the exit barrier is within any of the ranges disclosed above and the ratio of the energy of the exit barrier to the energy of the second barrier is within any of the ranges disclosed above.

Various configurations of the single-phonon-resonance multiquantum well structures may be used in which the injection barrier, first barrier, second barrier, and exit barrier have the energies disclosed above in various combinations.

In some embodiments of the single-phonon-resonance multiquantum well structures, a quantum well is between the injection barrier and the single-phonon-resonance multiquantum well structure, such that the first barrier of the single-phonon-resonance multiquantum well structure is adjacent to the quantum well which is adjacent to the injection barrier. In some such embodiments, the single-phonon-resonance multiquantum well structure is adjacent to the exit barrier such that the second quantum well of the single-phonon-resonance multiquantum well structure is adjacent to the exit barrier.

The energy of a barrier in the active region may be defined as the difference in energy between the top of the barrier and the bottom of the adjacent, upstream quantum well (upstream refers to the direction opposite the direction of electron flow in a QCL device incorporating the active region). For example, in the conventional QCL of FIG. 1, the energy of the exit barrier 110 is the difference in energy between the top of the barrier 110 and the bottom of the adjacent, upstream quantum well 114.

Figure 2A:
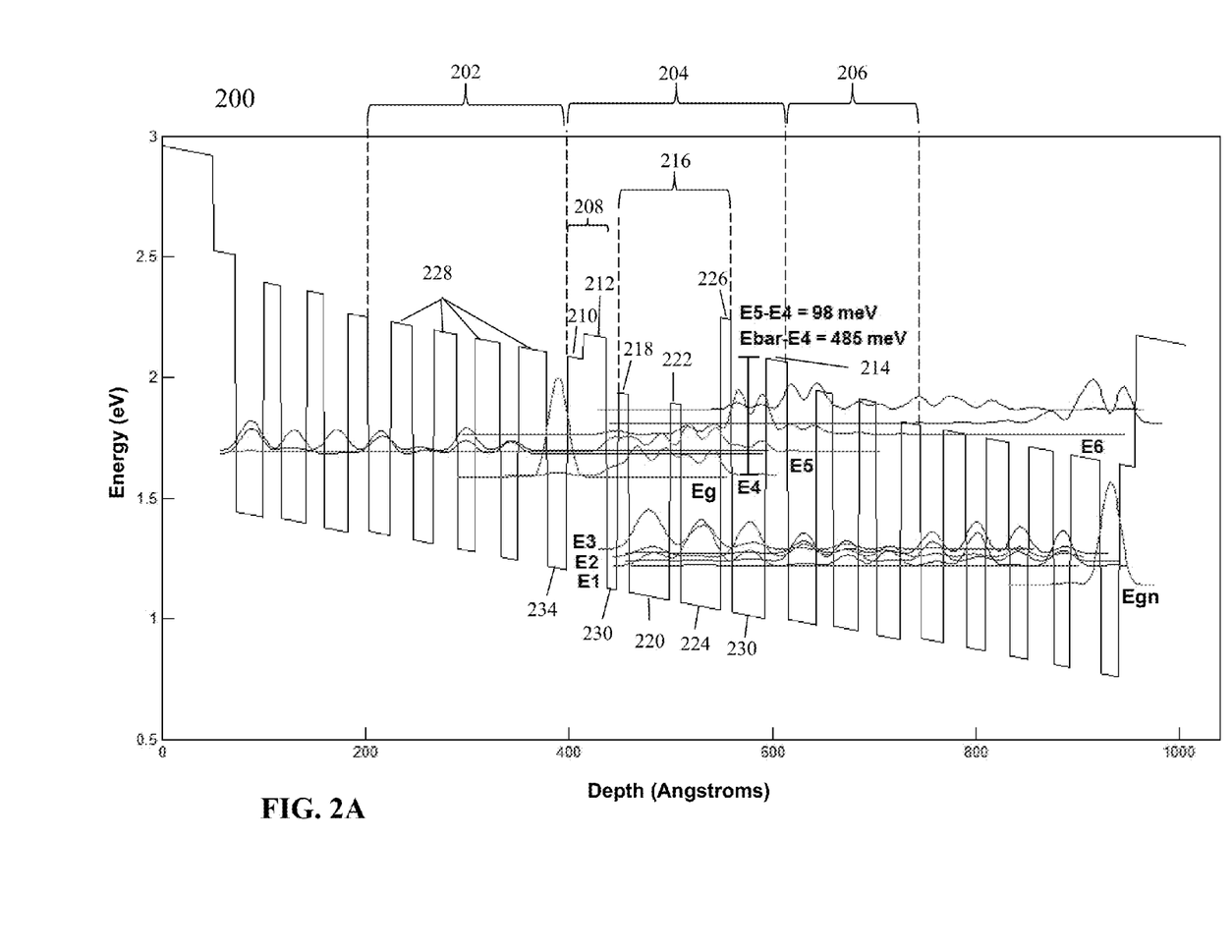
FIG. 2A shows the band diagram and relevant wavefunctions for an exemplary embodiment of the disclosed semiconductor structures. The structure is configured to provide a laser device emitting radiation at a wavelength of 4.0 μm.
Figure 2B:
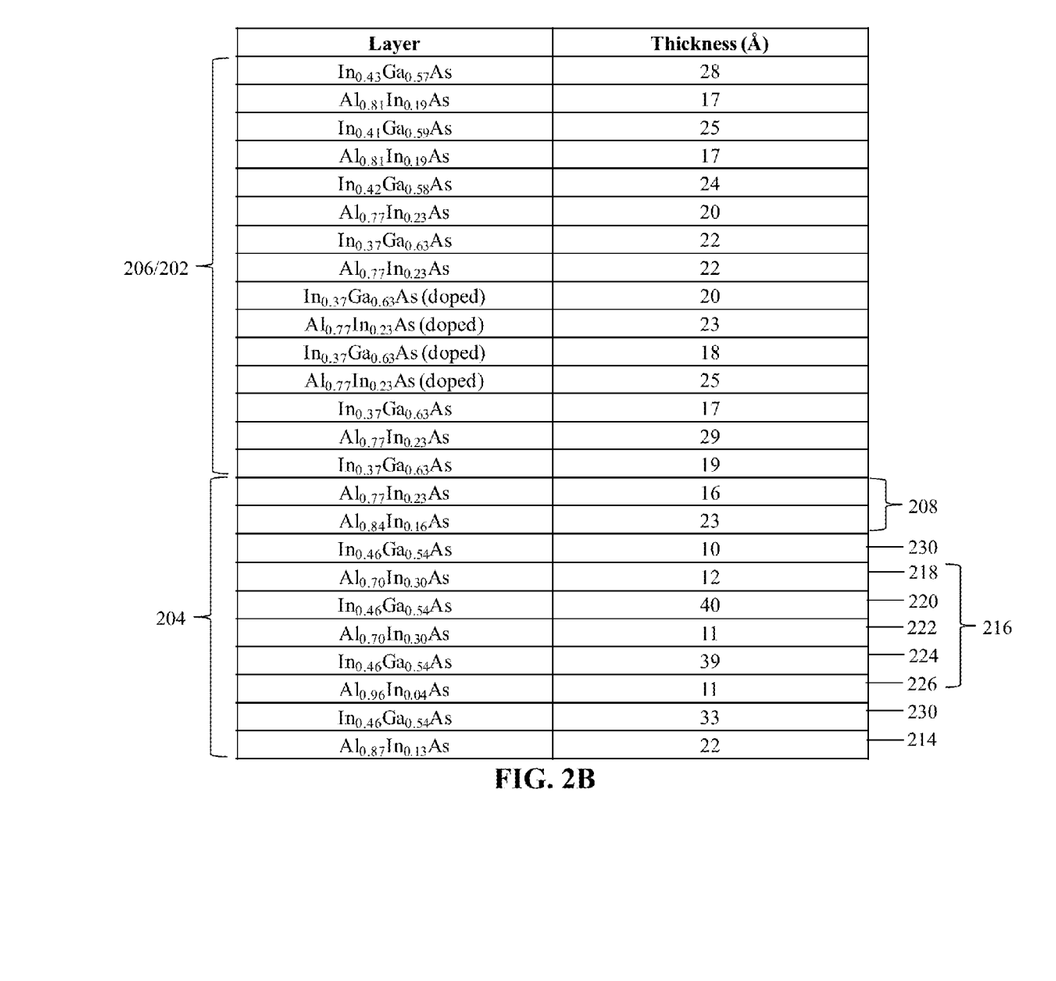
FIG. 2B shows the compositions and thicknesses of each of the quantum wells and barriers in the semiconductor structure of FIG. 2A.

The barriers of the active region of the disclosed semiconductor structures may be composite barriers. Composite barriers are barriers composed of two or more barrier layers of different semiconductors. As described above, the energy of a composite barrier may be defined with respect to the quantum well which is adjacent to and upstream of the composite barrier. The energy of a composite barrier will be of intermediate value between the energy of the barrier layer or barrier layers of highest energy and the energy value of the barrier layer or barrier layers of lowest energy. An exemplary composite barrier 208 is shown in FIG. 2A. This composite barrier includes a first barrier layer 210 and a second barrier layer 212. As shown in FIG. 2B, the compositions of the first barrier layer ($Al_{0.77}In_{0.23}As$) and second barrier layer ($Al_{0.84}In_{0.16}As$) differ. The energy of the composite barrier 208 is of intermediate value between the energy of the first barrier layer 210 (the difference in energy between the top of the first barrier layer and the bottom of the adjacent, upstream quantum well 234) and the energy of the second barrier layer 212 (the difference in energy between the top of the second barrier layer and the bottom of the adjacent, upstream quantum well 234). In some embodiments, the injection barrier in any of the disclosed semiconductor structures is a composite injection barrier including a first barrier layer and a second barrier layer.

The quantum wells of the active region of the disclosed semiconductor structures may be deep quantum wells. A deep quantum well is a quantum well having a well bottom that is lower in potential energy than the bottoms of the quantum wells in the adjacent and upstream electron injector. A deep quantum well will have a well bottom that is lower in potential energy than the well bottoms of the quantum wells in the adjacent injector region regardless of whether or not the semiconductor structure is under the influence of an applied electric field. That is, a deep quantum well will have a well bottom that remains lower in potential energy than the well bottoms of the quantum wells in the adjacent injector region even when the semiconductor structure is unbiased. Exemplary deep quantum wells 220, 224, 230 are shown in FIG. 2A. In some embodiments, at least one of the quantum wells in the active region is a deep quantum well. In some embodiments, the quantum well adjacent to and downstream from the injection barrier is a deep quantum well. In some embodiments, each of the quantum wells in the multiquantum well structure is a deep quantum well. In some embodiments, each of the quantum wells in the active region is a deep quantum well.

The disclosed semiconductor structures may comprise quantum wells and barriers having a variety of compositions. In some embodiments, the semiconductor structure comprises quantum wells of InGaAs and barriers of AlInAs. In such embodiments, the semiconductor structure could also comprise barriers of AlAs. In other embodiments, the semiconductor structure comprises quantum wells of InGaAs and barriers of AlAsSb. In such embodiments, the semiconductor structure could also comprise barriers of AlAs. In still further embodiments, the semiconductor structure comprises quantum wells of GaAs and barriers of AlGaAs. In still further embodiments, the semiconductor structure comprises quantum wells of InGaAs, quantum wells of GaAs, barriers of AlGaAs, barriers of AlGaAsP, and barriers of GaAsP. Quantum wells and barriers may be doped or undoped. Specific, exemplary compositions for quantum wells and barriers are provided in FIGS. 2B, 3B, and 4B. It is to be understood that at least some of the compositions above are alloys in which the relative proportions of certain elements may vary. As one example only, InGaAs refers to an alloy of indium, gallium and arsenic in which the relative proportions of indium and gallium may vary.

The active region of the disclosed semiconductor structures includes upper energy states 4 and 5 (e.g., see the exemplary embodiment shown in FIG. 2A), wherein the energy difference between energy states 4 and 5 is denoted by $E_{54}$. By contrast to conventional and other QCLs, at least certain embodiments of disclosed semiconductor structures provide much higher values of $E_{54}$, contributing to the virtual suppression of electron leakage. In some embodiments, $E_{54}$ is at least 90 meV. This includes embodiments in which $E_{54}$ is at least 95 meV, at least 98 meV, or at least 100 meV. Similarly, at least certain embodiments of the disclosed semiconductor structures provide much higher values of $\tau_{54}$, further contributing to the virtual suppression of electron leakage. In some embodiments, $\tau_{54}$ is at least 1.0 ps. This includes embodiments in which $\tau_{54}$ is at least about 1.1 ps, at least 1.2 ps, at least 1.3 ps, at least 1.4 ps, or at least 1.5 ps. In some such embodiments, the semiconductor structures are configured to provide a laser device emitting radiation in the wavelength range of 4.5-8.5 μm. In addition, at least certain embodiments of the disclosed semiconductor structures provide much higher values of $\tau_{up,g}$, directly contributing to reduced $J_{th}$. In some embodiments, $\tau_{up,g}$ is at least 1.4 ps. This includes embodiments in which $\tau_{up,g}$ is at least 1.5 ps, at least 1.6 ps, at least 1.7 ps, at least 1.8 ps, or at least 2 ps.

The disclosed semiconductor structures may be configured to provide laser devices emitting in the mid- to long-wavelength infrared range (i.e., 3-16 μm). In some embodiments, the semiconductor structure is configured to provide a laser device emitting radiation in the wavelength range from about 3 μm to about 4 μm, from about 3 μm to about 5 μm, from about 3.5 μm to about 5 μm, from about 4 μm to about 5 μm, from about 4.5 μm to about 5 μm, from greater than about 5 μm, from greater than about 8 μm, or from about 8 μm to about 16 μm. Thus, also provided are the laser devices including any of the disclosed semiconductor structures. Such laser devices include a plurality of laser stages, each laser stage comprising any of the disclosed semiconductor structures. In some embodiments, the laser devices include at least 10, at least 25, at least 30, or at least 40 laser stages. The laser devices may include other known components for configuring QCL-type semiconductor structures into laser devices, e.g. an additional extractor region and injector region for providing a final electron Bragg mirror, a transverse optical waveguide, a substrate, and a contact layer. Additional details regarding certain of these components may be found in at least J. C. Shin et al, "Ultra-low temperature sensitive deep-well quantum cascade lasers (λ=4.8 μm) via uptapering conduction band edge of injector regions," Electronics Letters, Jul. 2, 2009, Vol. 45, No. 14.

As noted above, at least certain of the disclosed semiconductor structures are capable of providing laser devices including the structures with superior electro-optical characteristics, including low electron leakage, low values of $J_{th}$ at room temperature, and high maximum wallplug efficiencies. In some embodiments, the semiconductor structure is configured to provide a laser device emitting from about 4 μm to about 5 μm, wherein the laser device is characterized by a relative leakage-current density value ($J_{leak}/J_{th}$) of 5% or less. This includes embodiments in which $J_{leak}/J_{th}$ is 4% or less, 3% or less, 2% or less, or 1% or less. The threshold-current density, $J_{th}$, may be calculated as described above, or may be experimentally determined using known methods. The electron leakage-current density, $J_{leak}$, may also be calculated from the appropriate equations found in D. Botez, et al., "Temperature dependence of the key electro-optical characteristics for mid-infrared emitting quantum cascade lasers," Applied Physics Letters, 97, 071101 (2010) and D. Botez, et al., Erratum: "Temperature dependence of the key electro-optical characteristics for midinfrared emitting quantum cascade lasers" [Appl. Phys. Lett. 97, 071101 (2010)], Applied Physics Letters, 97, 199901 (2010), each of which is hereby incorporated by reference in its entirety.

In some embodiments, the semiconductor structure is configured to provide a laser device emitting radiation in the wavelength range from about 3.5 to about 4 μm, wherein the laser device exhibits a room temperature CW maximum wallplug efficiency ($\eta_{wp,max}$) greater than 10%. This includes embodiments in which the room temperature CW maximum wallplug efficiency is greater than 11%, greater than 12%, greater than 13%, greater than 14%, or greater than 15%. In some embodiments, the semiconductor structure is configured to provide a laser device emitting radiation in the wavelength range from about 4 to about 5 μm, wherein the laser device exhibits a front-facet, room temperature CW maximum wallplug efficiency ($\eta_{wp,max}$) greater than 20%. This includes embodiments in which the front-facet, room temperature CW maximum wallplug efficiency is greater than 22%, greater than 24%, greater than 26%, or greater than 28%. The $\eta_{wp,max}$ value may be calculated from the appropriate equations found in D. Botez, et al., "Temperature dependence of the key electro-optical characteristics for mid-infrared emitting quantum cascade lasers," Applied Physics Letters, 97, 071101 (2010), which is hereby incorporated by reference in its entirety.

Known methods may be used to form the disclosed semiconductor structures and laser devices. For example, semiconductor structures may be grown on an appropriate substrate (e.g., InP, GaAs, GaSb, and InAs) using metal-organic chemical vapor deposition (MOCVD). Metamorphic buffer layer structures may be used for growth as described in U.S. Ser. No. 13/283,855, which is incorporated by reference in its entirety.

The semiconductor structures and laser devices will be understood more readily by reference to the following examples, which are provided by way of illustration and are not intended to be limiting.

EXAMPLES

Example 1

Semiconductor Structure for a 4.0 µm-Emitting Laser Device

An exemplary embodiment of the disclosed semiconductor structures is shown in FIG. 2 and is further discussed below. FIG. 2A shows the band diagram and relevant wavefunctions for a semiconductor structure 200 under an applied field of 82 kV/cm (i.e., under bias). The semiconductor structure 200 is configured to provide a laser device emitting radiation at a wavelength of 4.0 µm. FIG. 2B shows the compositions and thicknesses of each of the quantum wells and barriers in the semiconductor structure 200 of FIG. 2A. The semiconductor structure is grown on a metamorphic buffer layer structure, which itself is grown on a GaAs substrate. The upper layer of the metamorphic buffer layer structure corresponds to an $In_{0.30}Ga_{0.70}As$ virtual substrate.

Referring to FIG. 2A, the semiconductor structure 200 includes an electron injector 202, an active region 204, and an electron extractor 206. The active region 204 includes an injection barrier 208, which is a composite injection barrier including a first barrier layer 210 and a second barrier layer 212. As discussed above, the energy of the injection barrier 208 will be determined with respect to the adjacent, upstream quantum well 234 and will have an intermediate value between the energy of the first barrier layer 210 and the energy of the second barrier layer 212. The active region also includes an exit barrier 214. The active region also includes a coupled multiquantum well structure 216. The coupled multiquantum well structure includes a first barrier 218, a first quantum well 220, a second barrier 222, a second quantum well 224, and a third barrier 226. The energies of the first barrier 218 and the second barrier 222 are less than the energy of the third barrier 226 and less than the energy of the barriers 228 of the electron injector. The energy of the first barrier 218 is the same as the energy of the second barrier 222. The difference in energy between the second barrier 222 and the third barrier 226 is 400 meV and the ratio of the energy of the third barrier and the energy of the second barrier is 1.49. The energy of the third barrier 226 is greater than the energy of the barriers 228 of the electron injector. The energies of the injection barrier 208 and the exit barrier 214 are also greater than the energy of the barriers 228 of the electron injector. The energy of the injection barrier 208 is less than the energy of the third barrier 226 and the energy of the exit barrier 214. The energy of the exit barrier 214 is also less than the energy of the third barrier 226. The quantum wells 230 of the active region, including the quantum wells 220 and 224 of the coupled multiquantum well structure, are all deep quantum wells. These layers are also identified in the composition table shown in FIG. 2B.

FIG. 2A also shows that the $E_{54}$ value for the semiconductor structure 200 is 98 meV. The value for $\tau_{54}$ is 0.60 ps. As a result, electron leakage is greatly suppressed. The value for $\tau_{up,g}$ is 1.27 ps. It is estimated that the relative leakage-current density, $J_{leak}/J_{th}$, at room temperature for a laser device including the semiconductor structure 200 is at least 5 times smaller than for a conventional QCL emitting at 4.0 µm. As a result, it is further estimated that the room temperature CW wallplug efficiency for a laser device including the semiconductor structure 200 is at least two times greater than for a conventional QCL emitting at 4.0 µm.

Example 2

Semiconductor Structure for a 4.7 µm-Emitting Laser Device

Figure 3A:
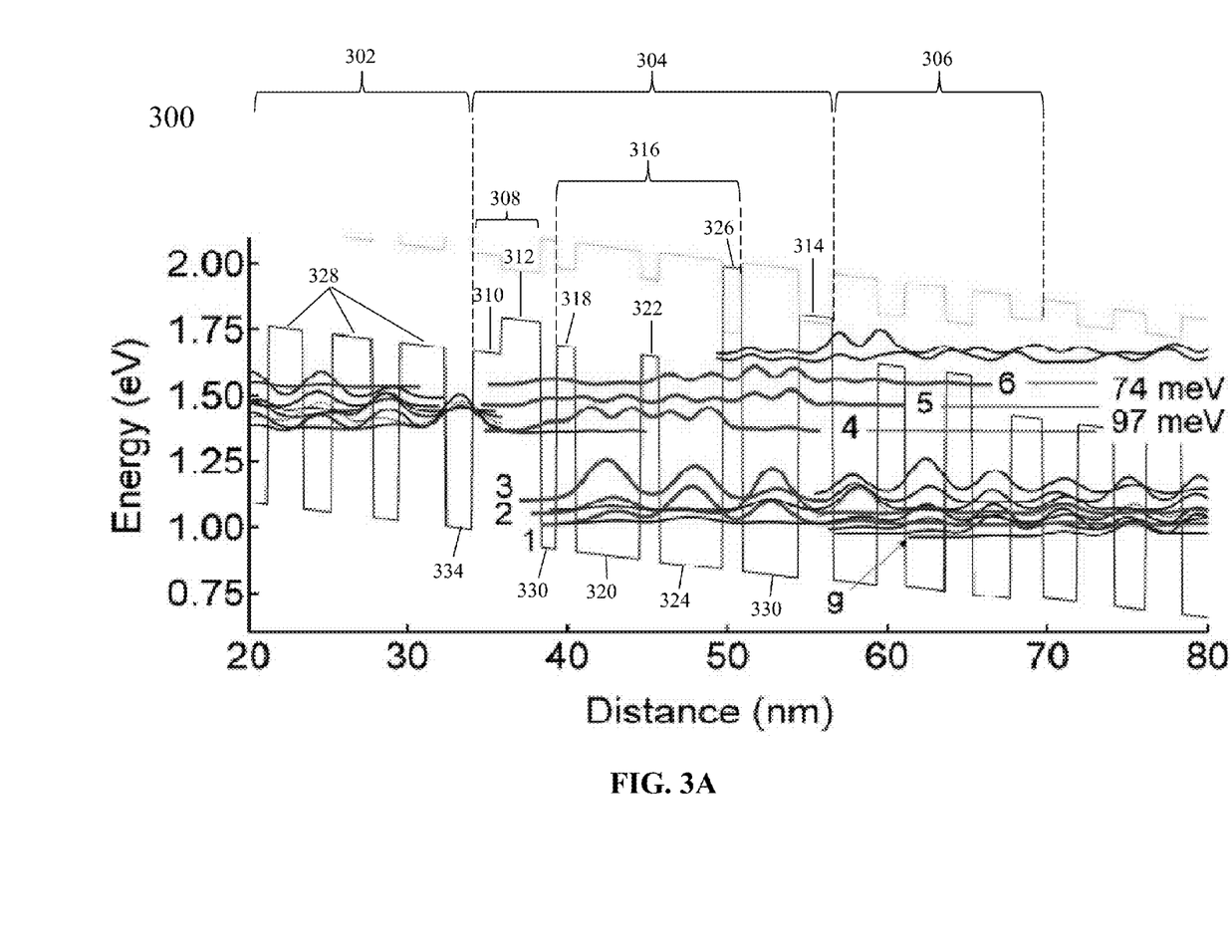
FIG. 3A shows the band diagram and relevant wavefunctions for an exemplary embodiment of the disclosed semiconductor structures. The structure is configured to provide a laser device emitting radiation at a wavelength of 4.7 μm.
Figure 3B:
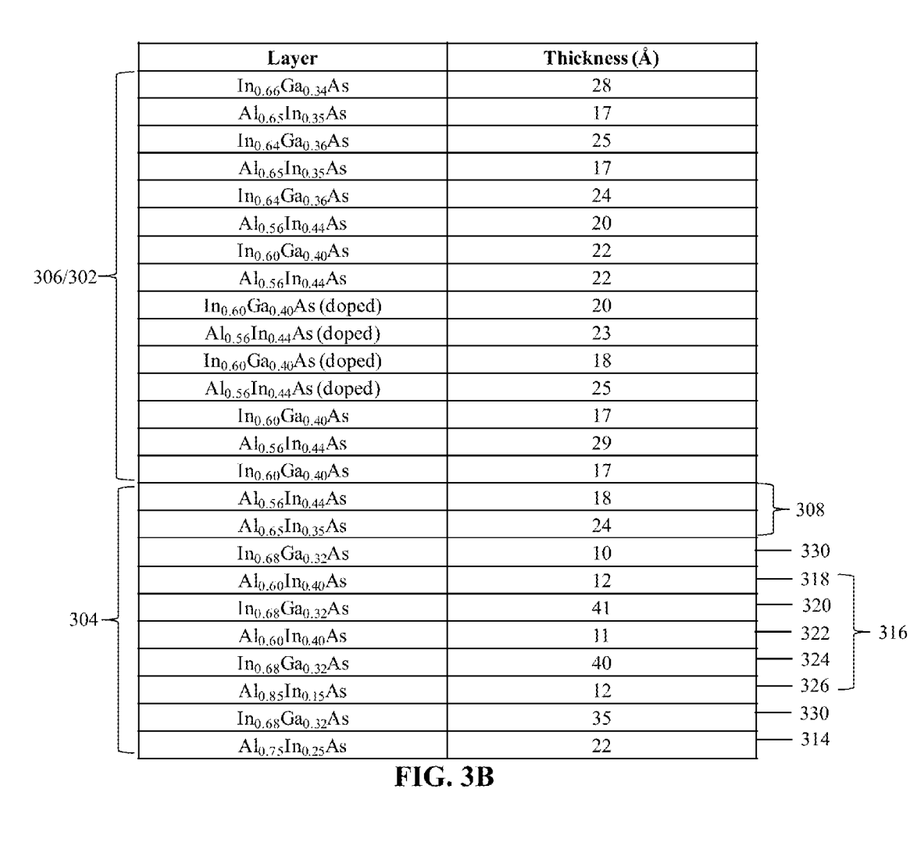
FIG. 3B shows the compositions and thicknesses of each of the quantum wells and barriers in the semiconductor structure of FIG. 3A.

An exemplary embodiment of the disclosed semiconductor structures is shown in FIG. 3 and is further discussed below. FIG. 3A shows the band diagram and relevant wavefunctions for a semiconductor structure 300 under an applied field of 72 kV/cm (i.e., under bias). The semiconductor structure 300 is configured to provide a laser device emitting radiation at a wavelength of 4.7 µm. FIG. 3B shows the compositions and thicknesses of each of the quantum wells and barriers in the semiconductor structure 300 of FIG. 3A.

Referring to FIG. 3A, the semiconductor structure 300 includes an electron injector 302, an active region 304, and an electron extractor 306. The active region 304 includes an injection barrier 308, which is a composite injection barrier including a first barrier layer 310 and a second barrier layer 312. As discussed above, the energy of the injection barrier 308 will be determined with respect to the adjacent, upstream quantum well 334 and will have an intermediate value between the energy of the first barrier layer 310 and the energy of the second barrier layer 312. The active region also includes an exit barrier 314. The active region also includes a coupled multiquantum well structure 316. The coupled multiquantum well structure includes a first barrier 318, a first quantum well 320, a second barrier 322, a second quantum well 324, and a third barrier 326. The energies of the first barrier 318 and the second barrier 322 are less than the energy of the third barrier 326 and greater than the energy of the barriers 328 of the electron injector. The energy of the first barrier 318 is the same as the energy of the second barrier 322. The difference in energy between the second barrier 322 and the third barrier 326 is 373 meV and the ratio of the energy of the third barrier and the energy of the second barrier is 1.48. The energy of the third barrier 326 is greater than the energy of the barriers 328 of the electron injector. The energies of the injection barrier 308 and the exit barrier 314 are also greater than the energy of the barriers 328 of the electron injector. The energy of the injection barrier 308 is less than the energy of the third barrier 326 and the energy of the exit barrier 314. The energy of the exit barrier 314 is also less than the energy of the third barrier 326. The quantum wells 330 of the active region, including the quantum wells 320 and 324 of the coupled multiquantum well structure, are all deep quantum wells. These layers are also identified in the composition table shown in FIG. 3B.

FIG. 3A also shows that the $E_{54}$ value for the semiconductor structure 300 is 97 meV. The value for $\tau_{54}$ is 1.17 ps. As a result, electron leakage is greatly suppressed. The value for $\tau_{up,g}$ is 1.50 ps, thereby further reducing $J_{th}$. It is estimated that the relative leakage-current density, $J_{leak}/J_{th}$, at room temperature for a laser device including the semiconductor structure 300 is about 1.6%. As a result, it is further estimated that the front-facet, room temperature CW wallplug efficiency for a laser device including the semiconductor structure 300 is about 27%. The values for a conventional QCL emitting at 4.7 µm are as follows: $\tau_{up,g}$ (1.235 ps), $\tau_{54}$ (0.25 ps) and $J_{leak}/J_{th}$ at room temperature (15%).

Example 3

Semiconductor Structure for an 8.0 µm-Emitting Laser Device

Figure 4A:
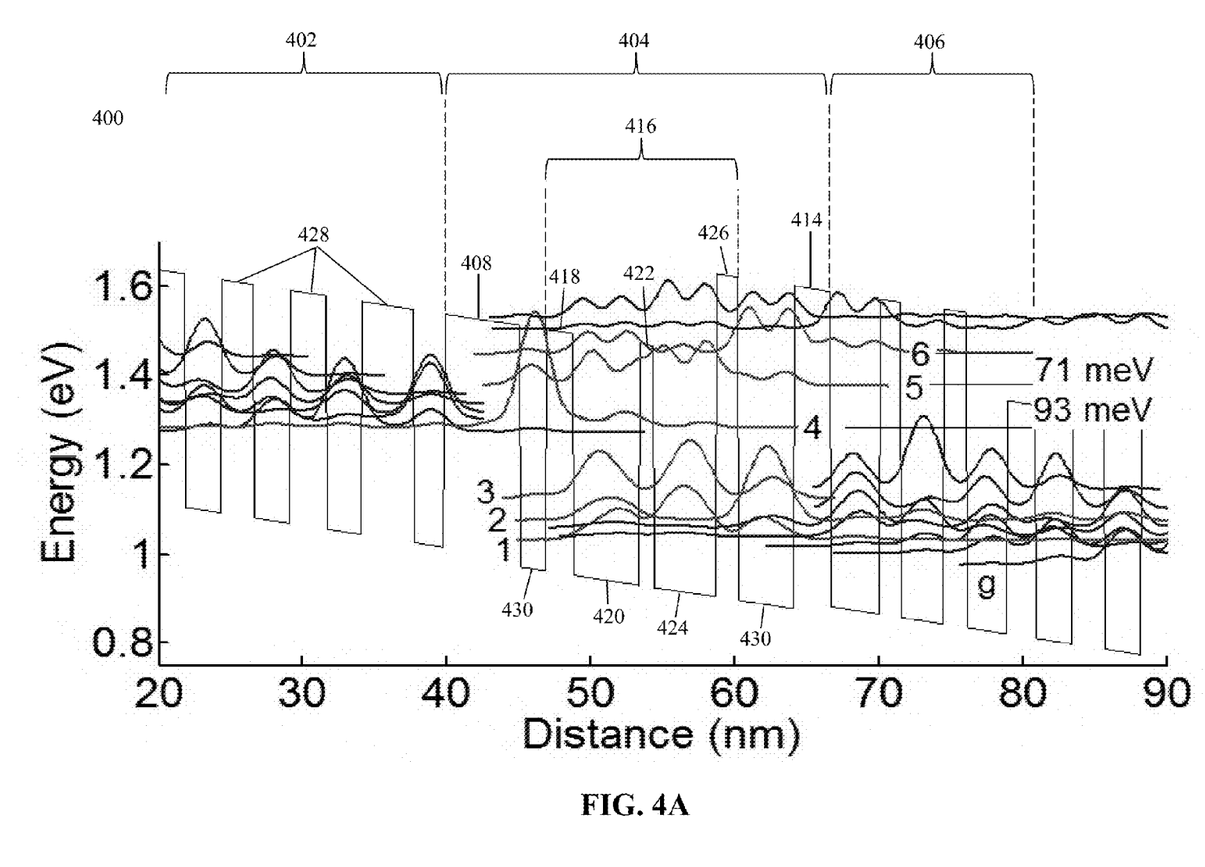
FIG. 4A shows the band diagram and relevant wavefunctions for an exemplary embodiment of the disclosed semiconductor structures. The structure is configured to provide a laser device emitting radiation at a wavelength of 8.0 μm.
Figure 4B:
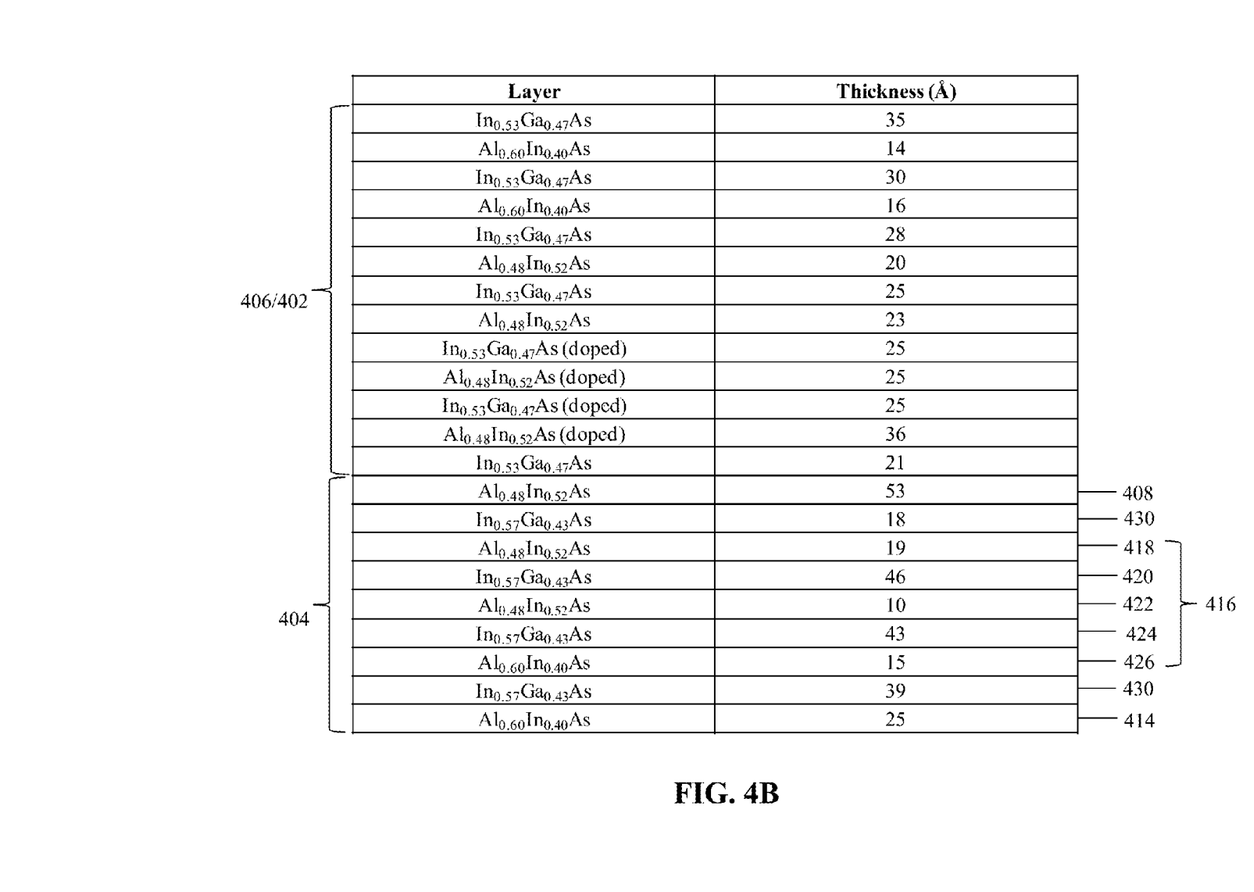
FIG. 4B shows the compositions and thicknesses of each of the quantum wells and barriers in the semiconductor structure of FIG. 4A.

An exemplary embodiment of the disclosed semiconductor structures is shown in FIG. 4 and is further discussed below.

FIG. 4A shows the band diagram and relevant wavefunctions for a semiconductor structure 400 under an applied field of 52 kV/cm (i.e., under bias). The semiconductor structure 400 is configured to provide a laser device emitting radiation at a wavelength of 8.0 μm. FIG. 4B shows the compositions and thicknesses of each of the quantum wells and barriers in the semiconductor structure 400 of FIG. 4A.

Referring to FIG. 4A, the semiconductor structure 400 includes an electron injector 402, an active region 404, and an electron extractor 406. The active region 404 includes an injection barrier 408. The active region also includes an exit barrier 414. The active region also includes a coupled multi-quantum well structure 416. The coupled multiquantum well structure includes a first barrier 418, a first quantum well 420, a second barrier 422, a second quantum well 424, and a third barrier 426. The energies of the first barrier 418 and the second barrier 422 are less than the energy of the third barrier 426 and greater than the energy of the barriers 428 of the electron injector. The energy of the first barrier 418 is the same as the energy of the second barrier 422. The difference in energy between the second barrier 422 and the third barrier 426 is about 185 meV and the ratio of the energy of the third barrier and the energy of the second barrier is about 1.35. The energy of the third barrier 426 is greater than the energy of the barriers 428 of the electron injector. The energy of the injection barrier 408 is the same as the energy of the barriers 428 of the electron injector. The energy of the exit barrier 414 is greater than the energy of the barriers 428 of the electron injector. The energy of the injection barrier 408 is less than the energy of the third barrier 426 and the energy of the exit barrier 414. The energy of the exit barrier 414 is the same as the energy of the third barrier 426. The quantum wells 430 of the active region, including the quantum wells 420 and 424 of the coupled multiquantum well structure, are all deep quantum wells. These layers are also identified in the composition table shown in FIG. 4B.

FIG. 4A also shows that the $E_{54}$ value for the semiconductor structure 400 is 93 meV. The value for $\tau_{54}$ is 1.18 ps. As a result, electron leakage is greatly suppressed. The value for $\tau_{up,g}$ is 2 ps, thereby further reducing $J_{th}$. It is estimated that the relative leakage-current density, $J_{leak}/J_{th}$, at room temperature for a laser device including the semiconductor structure 400 is 25% or less of the value for a conventional QCL emitting at 8.0 μm. The values for a conventional QCL emitting at 8.0 μm are as follows: $E_{54}$ (53 meV), $\tau_{up,g}$ (≤2 ps) and $\tau_{54}$ (0.43 ps).

For the purposes of this disclosure and unless otherwise specified, "a" or "an" means "one or more". Still further, the use of "and" or "or" is intended to include "and/or" unless specifically indicated otherwise.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A semiconductor structure comprising:
an electron injector, an active region adjacent to the electron injector, and an electron extractor adjacent to the active region, the electron injector, active region, and electron extractor each comprising layers of semiconductor, the layers configured to provide alternating quantum wells and barriers,
wherein the active region comprises an injection barrier, an exit barrier and a multiquantum well structure between the injection barrier and the exit barrier, the multiquantum well structure comprising
a first barrier,
a first quantum well adjacent to the first barrier,
a second barrier adjacent to the first quantum well,
a second quantum well adjacent to the second barrier, and
a third barrier adjacent to the second quantum well,
wherein the energies of the first barrier and the second barrier are less than the energy of the third barrier, the energy difference between the energy of the second barrier and the energy of the third barrier is greater than 225 meV and the ratio of the energy of the third barrier to the energy of the second barrier is greater than 1.26.

2. The semiconductor structure of claim 1, wherein the energy difference between the energy of the second barrier and the energy of the third barrier is greater than 350 meV and the ratio of the energy of the third barrier to the energy of the second barrier is greater than 1.40.

3. The semiconductor structure of claim 1, wherein the energy of the first barrier is substantially the same as the energy of the second barrier.

4. The semiconductor structure of claim 1, wherein the energy of at least one of the first barrier and the second barrier is equal to or less than the energy of the barriers of the electron injector.

5. The semiconductor structure of claim 1, wherein the energy of the third barrier is greater than the energy of the exit barrier.

6. The semiconductor structure of claim 1, wherein the energy of the first barrier is substantially the same as the energy of the second barrier, the energy of the third barrier is greater than the energy of the exit barrier, and the energy of the third barrier and the energy of the exit barrier are greater than the energy of the barriers of the electron injector.

7. The semiconductor structure of claim 6, wherein the energy of at least one of the first barrier and the second barrier is less than the energy of the barriers of the electron injector.

8. The semiconductor structure of claim 6, wherein the energy of at least one of the first barrier and the second barrier is greater than the energy of the barriers of the electron injector.

9. The semiconductor structure of claim 1, wherein the first quantum well of the multiquantum well structure and the second quantum well of the multiquantum well structure are deep quantum wells.

10. The semiconductor structure of claim 1, wherein all of the quantum wells of the active region are deep quantum wells.

11. The semiconductor structure of claim 1, wherein the semiconductor structure is configured to provide a laser device emitting radiation in the wavelength range of about 3.5 µm to about 5 µm.

12. A laser device comprising a plurality of laser stages, each laser stage comprising the semiconductor structure of claim 1.

13. A semiconductor structure comprising:
an electron injector, an active region adjacent to the electron injector, and an electron extractor adjacent to the active region, the electron injector, active region, and electron extractor each comprising layers of semiconductor, the layers configured to provide alternating quantum wells and barriers,
wherein the active region comprises an injection barrier, an exit barrier and a multiquantum well structure between the injection barrier and the exit barrier, the multiquantum well structure comprising
a first barrier,
a first quantum well adjacent to the first barrier,
a second barrier adjacent to the first quantum well,
a second quantum well adjacent to the second barrier, and
a third barrier adjacent to the second quantum well,
wherein the energies of the first barrier and the second barrier are less than the energy of the third barrier, the energy difference between the energy of the second barrier and the energy of the third barrier is greater than 150 meV and the ratio of the energy of the third barrier to the energy of the second barrier is greater than 1.26, and further wherein the semiconductor structure is configured to provide a laser device emitting at a wavelength greater than about 5 µm.

14. The semiconductor structure of claim 13, wherein the energy of the first barrier is substantially the same as the energy of the second barrier, the energies of the third barrier and the exit barrier are greater than the energy of the barriers of the electron injector, and the energy of the third barrier is substantially the same as the energy of the exit barrier.

15. The semiconductor structure of claim 14, wherein the energy of at least one of the first barrier and the second barrier is greater than the energy of the barriers of the electron injector.

16. The semiconductor structure of claim 13, wherein the semiconductor structure is configured to provide a laser device emitting at a wavelength of about 8 µm or greater.

17. A laser device comprising a plurality of laser stages, each laser stage comprising the semiconductor structure of claim 13.

18. A semiconductor structure comprising:
an electron injector, an active region adjacent to the electron injector, and an electron extractor adjacent to the active region, the electron injector, active region, and electron extractor each comprising layers of semiconductor, the layers configured to provide alternating quantum wells and barriers,
wherein the active region comprises an injection barrier, an exit barrier and a multiquantum well structure between the injection barrier and the exit barrier, the multiquantum well structure comprising
a first barrier,
a first quantum well adjacent to the first barrier,
a second barrier adjacent to the first quantum well,
a second quantum well adjacent to the second barrier, and
a third barrier adjacent to the second quantum well,
wherein the energies of the first barrier and the second barrier are less than the energy of the third barrier, the energy of at least one of the first barrier and the second barrier is equal to or less than the energy of the barriers of the electron injector, and the energy of the third barrier is greater than the energy of the barriers of the electron injector.

19. The semiconductor structure of claim 18, wherein the energy of the first barrier is substantially the same as the energy of the second barrier.

20. The semiconductor structure of claim 19, wherein the energy of the third barrier is greater than the energy of the exit barrier.

21. A semiconductor structure comprising:
an electron injector, an active region adjacent to the electron injector, and an electron extractor adjacent to the active region, the electron injector, active region, and electron extractor each comprising layers of semiconductor, the layers configured to provide alternating quantum wells and barriers,
wherein the active region comprises an injection barrier, an exit barrier and a multiquantum well structure between the injection barrier and the exit barrier, the multiquantum well structure comprising
a first barrier,
a first quantum well adjacent to the first barrier,
a second barrier adjacent to the first quantum well, and
a second quantum well adjacent to the second barrier,
wherein the energies of the first barrier and the second barrier are less than the energy of the exit barrier, the energy difference between the energy of the second barrier and the energy of the exit barrier is greater than 225 meV and the ratio of the energy of the exit barrier to the energy of the second barrier is greater than 1.26.

22. The semiconductor structure of claim 21, wherein the energy difference between the energy of the second barrier and the energy of the exit barrier is greater than 350 meV and the ratio of the energy of the exit barrier to the energy of the second barrier is greater than 1.40.

23. The semiconductor structure of claim 21, wherein the energy of the first barrier is substantially the same as the energy of the second barrier.

24. The semiconductor structure of claim 21, wherein the energy of at least one of the first barrier and the second barrier is greater than the energy of the barriers of the electron injector.

25. The semiconductor structure of claim 21, wherein all of the quantum wells of the active region are deep quantum wells.

* * * * *